United States Patent [19]
Nara et al.

[11] Patent Number: 5,214,373
[45] Date of Patent: May 25, 1993

[54] ZERO PHASE VOLTAGE MEASURING DEVICE

[75] Inventors: Yoshikazu Nara, Osaka; Koji Kasai, Katano, both of Japan

[73] Assignee: Matsushita Electric Industrial Co., Ltd., Osaka, Japan

[21] Appl. No.: 893,205

[22] Filed: Jun. 2, 1992

[30] Foreign Application Priority Data

Jun. 3, 1991 [JP] Japan .................................. 3-130917

[51] Int. Cl.⁵ ............................................ G01R 19/00
[52] U.S. Cl. ...................................... 324/107; 361/76; 324/86; 324/509
[58] Field of Search ................. 324/107, 108, 86, 509; 340/664; 361/76, 85

[56] References Cited

U.S. PATENT DOCUMENTS

| | | | |
|---|---|---|---|
| 1,684,056 | 9/1928 | Evans | 324/108 |
| 2,583,798 | 1/1952 | Rowell et al. | 324/86 |
| 3,293,497 | 12/1966 | Brandler et al. | 324/509 |
| 3,584,299 | 6/1971 | Csete | 324/86 |
| 3,968,432 | 7/1976 | Kelley, Jr. | 324/107 |
| 4,060,843 | 11/1977 | Bost | 361/76 |
| 4,451,783 | 5/1984 | Shidlovsky et al. | |
| 4,819,119 | 4/1989 | Wilkinson | 361/76 |
| 4,901,005 | 2/1990 | Shin et al. | |

FOREIGN PATENT DOCUMENTS 56-53532 5/1981 Japan .
3-31768 2/1991 Japan .
3-56026 3/1991 Japan .

OTHER PUBLICATIONS

Report; F. Yoshinari et al., Chubu Denryoku Kenkyu Shiryo No. 80, issued by Chubu Denryoku Kabushiki Kaish in Jun. 1988–Japanese language–w/partial translation.

*Primary Examiner*—Kenneth A. Wieder
*Assistant Examiner*—Maura K. Regan
*Attorney, Agent, or Firm*—Ratner & Prestia

[57] ABSTRACT

A zero phase voltage measuring device for measuring a zero phase voltage of the three phase power system having an earth-fault includes an optic voltage sensor provided at any one of three power lines for detecting a current ground-to-line voltage thereat, a line-to-line voltage sensor provided between any two of the three power lines for detecting a current line-to-line voltage therebetween. A phase shifter and a multiplier are provided for calculating an ideal ground-to-line voltage at the power lines when no earth-fault is observed by changing the phase and multiplying the magnitude of the current line-to-line voltage. A subtracter is further provided to obtain a zero phase voltage signal by subtracting the ideal ground-to-line voltage from the current ground-to-line voltage.

6 Claims, 5 Drawing Sheets

ZERO PHASE VOLTAGE MEASURING DEVICE

BACKGROUND OF THE INVENTION

1. Field of the Invention

The present invention relates to a zero phase voltage measuring device for use in three phase power system and, more particularly, to a zero phase voltage measuring device for measuring a zero phase voltage of the three phase power system having an earth-fault.

2. Description of the Prior Art

Figure 7:
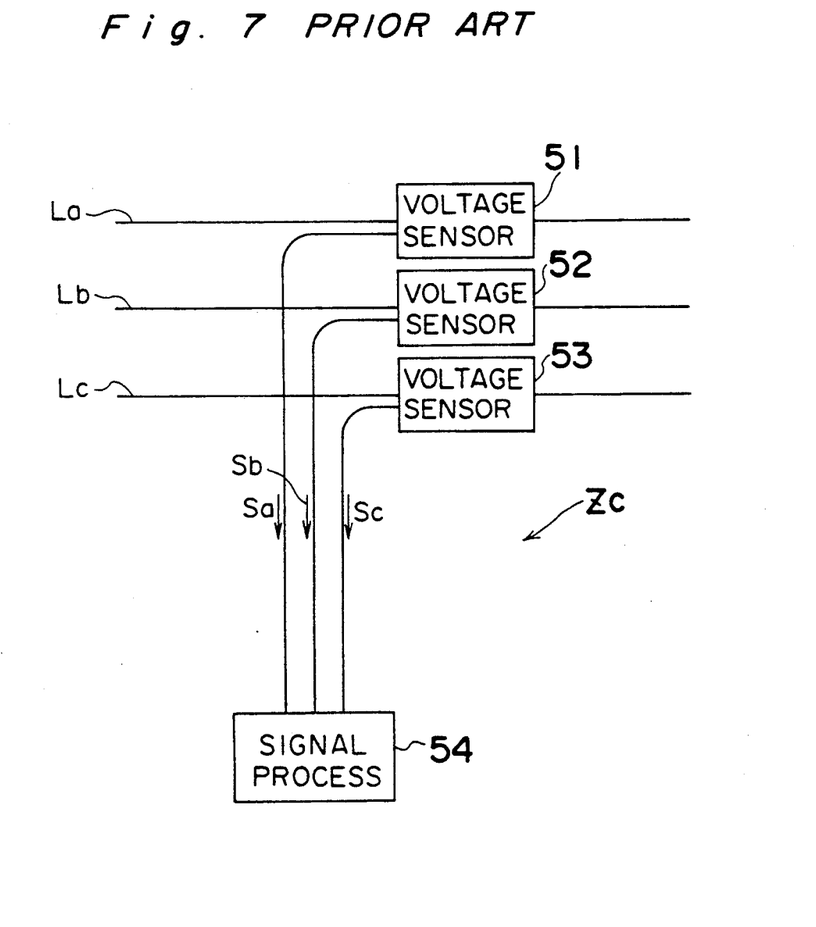
FIG. 7 is a block diagram of an example of a conventional zero phase voltage measuring.

FIG. 7 shows an example of conventional zero phase voltage measuring device Zc applied to a three phase power system having a first power line La of phase A, a second power line Lb of phase B, and a third power line Lc of phase C.

The zero phase voltage measuring device Zc includes a first voltage sensor 51 which is provided at the first power line La to detect the line-to-ground voltage thereat and produce a first voltage signal Sa in proportion to the detected voltage. A second and a third voltage sensors 52 and 53 are also provided for detecting and producing a second and a third voltage signals Sb and Sc in proportion to the line-to-ground voltages at lines Lb and Lc, respectively, in a manner similar to that of the first voltage sensor 51. As these voltage sensors 51, 52, and 53, a non contact type sensor such as an optical voltage sensor is used.

The zero phase voltage measuring device Zc further, includes a signal processing unit 54 which adds the voltage signals Sa, Sb, and Sc to produce a zero voltage signal which is in proportion to the zero phase voltage of the three phase power system.

However, the conventional zero phase voltage measuring device Zc requires three of the optical voltage sensors 51, 52, and 53 which are very expensive, resulting in such disadvantages that the cost is increased and the handling of three voltage sensors to set the power lines is very complicated at the measuring site. Furthermore, it is necessary to make a correction on each of three voltage sensors, which is a difficult and bothersome task.

SUMMARY OF THE INVENTION

The object of the present invention is therefore to provide a zero phase voltage measuring device which solves these problems.

The present invention has been developed with a view to substantially solving the above described disadvantages and has for its essential object to provide an improved zero phase voltage measuring device.

In order to achieve the aforementioned objective, a zero phase voltage measuring device for measuring the zero phase voltage of a three phase power system having three power lines comprises a first voltage detection means for detecting a current ground-to-line voltage presently obtained voltage between the ground and any one of the three power lines, a second voltage detection means for detecting a current line-to-line voltage representing a presently obtained voltage between any two of the three power lines, a voltage calculation means for calculating an ideal ground-to-line voltage representing a voltage between the ground and any one of the three power lines when no earth-fault is present based on the current line-to-line voltage, and a subtraction means for subtracting the ideal ground-to-line voltage from the current ground-to-line voltage to produce a zero phase voltage signal.

BRIEF DESCRIPTION OF THE DRAWINGS

These and other objects and features of the present invention will become clear from the following description taken in conjunction with the preferred embodiment thereof with reference to the accompanying drawings throughout which like parts are designated by like reference numerals, and in which.

DETAILED DESCRIPTION OF THE PREFERRED EMBODIMENTS

Figure 1:
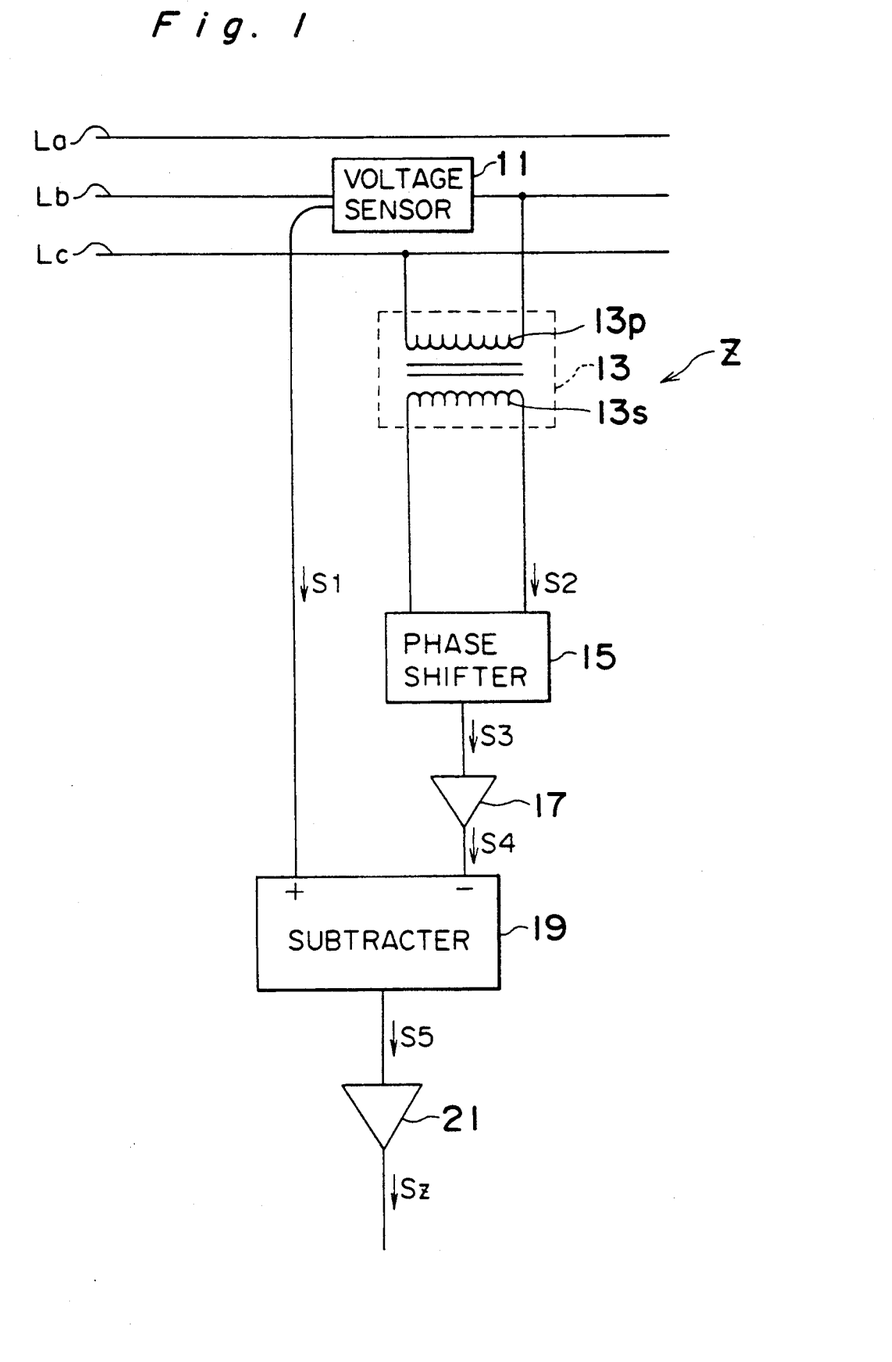
FIG. 1 is a block diagram of a zero phase voltage measuring device according to an embodiment of the present invention.

Referring to FIG. 1, a zero phase voltage device according to a preferred embodiment of the present invention applied to the three phase power system is shown. The three phase power system has a first power line La of phase A, a second power line Lb of phase B, and a third power line Lc of phase C.

The zero phase voltage device Z comprises a voltage sensor 11 which is provided on any of the three power lines La, Lb, and Lc to detect the ground-to-line voltage and produce a first ground-to-line voltage signal S1. In this embodiment, since the voltage sensor 11 is provided on the second power line Lb of phase B, the first ground-to-line voltage signal S1 indicative of the voltage between the line Lb and the ground is produced. An optical sensor of contactless type voltage sensor is employed as the voltage sensor 11 in this embodiment, but any other suitable sensor, such as a clamp type voltage sensor which can detect the ground-to-line voltage can be used.

The zero phase voltage measuring device Z further comprises a line voltage sensor 13 which is connected to any two of power lines La, Lb, and Lc to detect the line-to-line voltage and produce a line-to-line voltage signal S2. In this embodiment, since the line voltage sensor 13 is provided between the second and the third power lines Lb and Lc, the line voltage signal S2 indicative of a voltage between the lines Lb and Lc is produced. A transformer having a primary coil 13p connected to the power lines and a secondary coil 13s for outputting the line voltage signal S2 is employed as the line voltage sensor 13 in this embodiment. Any other suitable line voltage sensor, regardless of contact or contactless type, can be used.

A phase shifter 15 is provided to shift the phase of the voltage signal S2 by a predetermined angle and produces a shifted line-to-line voltage signal S3 in a manner which will be described later with reference to FIG. 5.

A multiplier 17 is provided to multiply the shifted line-to-line voltage signal S3 by a predetermined value and produces a second ground-to-line voltage signal S4 at the power line Lb when no earth-fault is observed in the three phase power system in a manner which will be described with reference to FIG. 5.

A subtracter 19 is provided to subtract the second ground-to-line voltage signal S4 from the first ground-to-line voltage signal S1 and produces a first zero phase signal S5 indicative of the zero phase voltage of the three phase power system.

A multiplier 21 is provided to multiply the first zero phase signal S5 by a second predetermined value and produces a second zero phase signal Sz representing the zero phase voltage of the three phase power system.

Figure 2A:
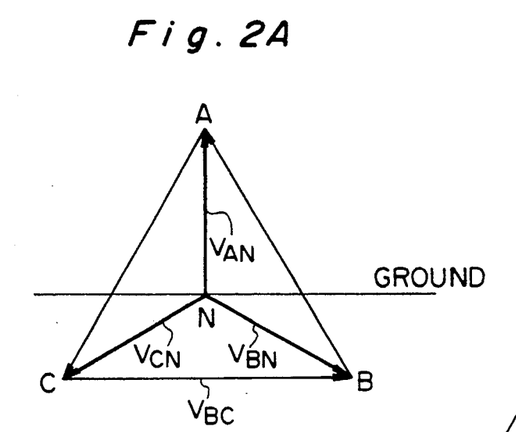
FIG. 2A is a graph showing the voltage vectors at the three phase power system having no earth-fault therein.

In FIG. 2A, voltage vectors of the three phase power system having no earth-fault is shown. A point N is a neutral point of three power lines La, Lb, and Lc. A vector $V_{BC}$ starting at a point C and terminating at a point B indicates the line-to-line voltage between the power lines Lb and Lc. A vector $V_{An}$ starting at the neutral point N and terminating at a point A indicates the ground-to-line voltage between the power line La and the ground. Similarly, a vector $V_{BN}$ and a vector $V_{CN}$ indicate the ground-to-line voltage at the power lines Lb and Lc, respectively. It is to be noted that the vectors $V_{AN}$, $V_{BN}$, and $V_{CN}$ are so balanced that their vector sum is equal to zero when the three phase power system has no earth-fault, as explained below.

Since voltage vectors $V_{AN}$, $V_{BN}$, and $V_{CN}$ have the same magnitude and are equidistantly shifted in phase, three points A, B, and C configure an equilateral triangle with the neutral point being as a center of gravity. Therefore, by adding the voltage vectors $V_{AN}$, $V_{BN}$, and $V_{CN}$, the result would be equal to zero, as expressed by the following equation.

$$V_{AN}+V_{BN}+V_{CN}=0 \quad (1)$$

Figure 2B:
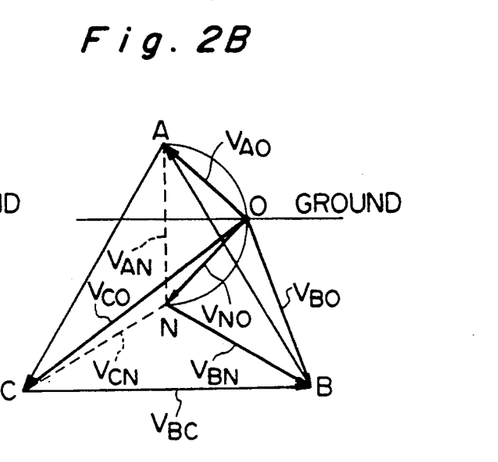
FIG. 2B is a graph showing voltage vectors at the three phase power system having an earth-fault therein.

In FIG. 2B, a case when one power line, for example, La is grounded is shown. A point O shows the ground potential and traces along a semicircle which diameter coincides with a line segment AN. When the electric resistance between the power line La and the ground is zero, the point O moves to the point A. When the electric resistance between the power line La and the ground is infinite, that is there is no earth-fault in the three phase power system, the point O moves to point N, as shown in FIG. 2A.

A vector $V_{AO}$ starting at the point O and terminating at the point A indicates the ground-to-line voltage at the power line La when the line La is grounded. Similarly, a vector $V_{BO}$ starting at the point O and terminating at the point B and a vector $V_{CO}$ starting at the point O and terminating the point C indicate the ground-to-line voltages at the power lines Lb and Lc, respectively, when the line La is grounded.

A zero phase voltage vector $V_O$ is obtained by summing these vectors $V_{AO}$, $V_{BO}$, and $V_{CO}$, as expressed by the following equation:

$$V_O = V_{AO} + V_{BO} V_{CO}.$$

Since, $$V_{NO} = V_{AO} - V_{AN} \quad (2)$$

$$V_{NO} = V_{BO} - V_{BN} \quad (3)$$

$$V_{NO} = V_{CO} - V_{CN}, \quad (4)$$

the following equation is obtained $$3V_{NO} = V_{AO} + V_{BO} + V_{CO}. \quad (5)$$

Thus, the zero phase voltage vector $V_O$ can be expressed by the following equation.

$$\begin{aligned}V_O &= V_{AO} + V_{BO} + V_{CO} \\ &= 3 \times V_{NO}\end{aligned} \quad (6)$$

These relationships described above are illustrated in FIG. 3.

Figure 3:
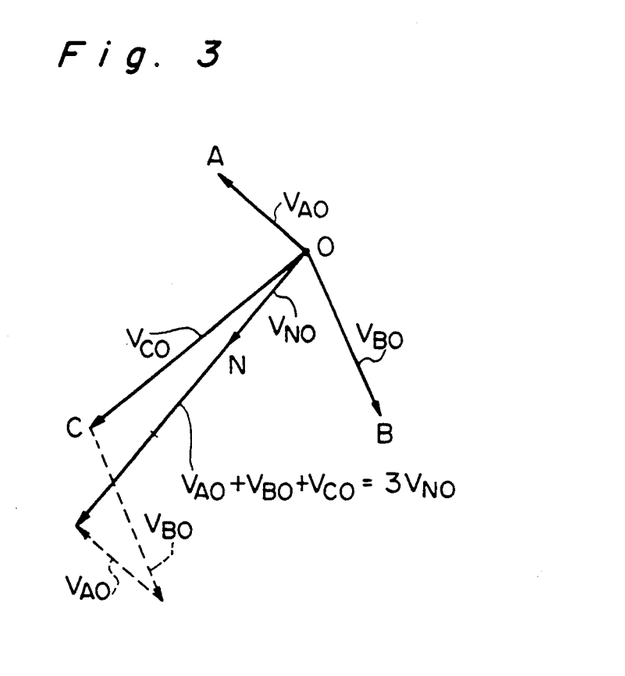
FIG. 3 is a graph showing a sum of three ground-to-line voltage vectors shown in FIG. 2B.

Since the vector $V_{No}$ is obtained by subtracting the vector $V_{BN}$ from the vector $V_{BO}$ as shown in the equation (3), the equation (6) can be expressed by the following equation.

$$V_O = 3 \times (V_{BO} - V_{BN}) \quad (7)$$

Figure 4:
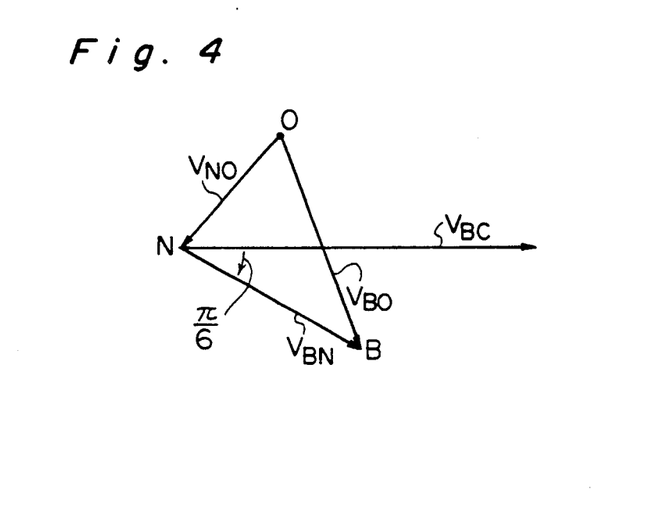
FIG. 4 is a graph showing the method for obtaining a ground-to-line voltage vector based on a line voltage vector shown in FIG. 2B.

Referring to FIG. 4, the vectors $V_{NO}$, $V_{BN}$, $V_{BO}$, and $V_{BC}$ are shown. As best shown in FIG. 2B, since the triangle ABC is an equilateral triangle having the center of gravity at the point N, the vectors $V_{BN}$ and $V_{BC}$ contain an angle of $\pi/6$. The vector $V_{BN}$ is lagged from the vector $V_{BC}$ by an angle $\pi/6$. and has a magnitude $1/\sqrt{3}$ times that of vector $V_{BC}$. Thus, the vector $V_{BN}$ can be obtained by lagging the vector $V_{BC}$ by an angle $\pi/6$ and multiplying the magnitude of the vector $V_{BC}$ by $1/\sqrt{3}$.

Referring back to FIG. 1, the operation of the zero phase voltage measuring device Z is described. The voltage sensor 11 produces the ground-to-line voltage signal S1 ($V_{BO}$). The line-to-line voltage sensor 13 produces the line-to-line voltage signal S2 ($V_{BC}$) representing the voltage between the lines Lb and Lc. The phase shifter 15 delays the phase of signal S2 ($V_{BC}$) by $\pi/6$ and produces the shifted line-to-line voltage signal S3 which phase is the same as that of the second ground-to-line voltage signal S4 ($V_{BN}$). The multiplier 17 multiplies the shifted line-to-line voltage signal S3 by $1/\sqrt{3}$ and produces the second ground-to-line voltage signal S4 ($V_{BN}$). The second ground-to-line voltage signal S4 ($V_{BN}$) is subtracted from the first ground-to-line voltage signal S1 ($V_{BO}$) by the subtracter 19, producing the first zero phase signal S5 ($V_{BO}-V_{BN}$). Furthermore, the multiplier 21 multiplies the first zero phase signal S5 ($V_{BO}-V_{BN}$) by three and produce the second zero phase signal Sz ($3\times(V_{BO}-V_{BN})$). Thus, the zero phase voltage signal Sz ($V_O$) is obtained based on the first ground-to-line voltage signal S1 and the line-to-line voltage signal S2 only.

Furthermore, the present invention can measure a zero phase voltage of the three phase power system by measuring a ground-to-line voltage at any one of the power lines La, Lb, and Lc and measuring a line-to-line voltage between any two of the power lines La, Lb, and Lc, which will be described herebelow.

Figure 5:
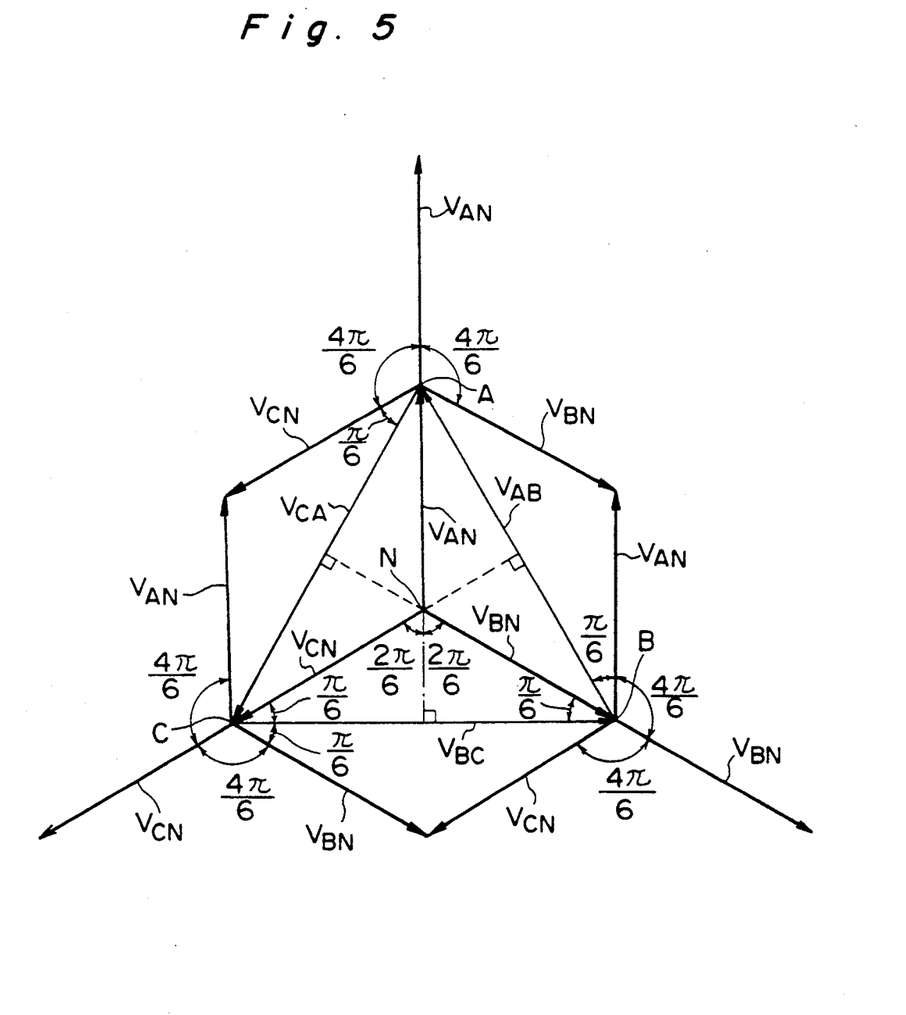
FIG. 5 is a graph showing the relationship between the voltage vectors shown in FIG. 2B.

Referring to FIG. 5, the relationships between the voltage vectors are shown. A vector $V_{AB}$ indicates the line-to-line voltage between the power lines La and Lb. A vector $V_{CA}$ indicates the line-to-line voltage between the power lines Lc and La. The vector $V_{AB}$, $V_{BC}$, and $V_{CA}$ are also shown so as to start at each of points A, B, and C for assistance in explaining the relationship of the vectors.

From FIG. 5, the following equations are obtained.

$$|V_{AN}| = |V_{BN}| = |V_{CN}| \tag{8}$$

$$|V_{AN}| \times \cos \pi/6 = \tfrac{1}{2} \times |V_{AB}| \tag{9}$$

$$|V_{BN}| \times \cos \pi/6 = \tfrac{1}{2} \times |V_{BC}| \tag{10}$$

$$|V_{CN}| \times \cos \pi/6 = \tfrac{1}{2} \times |V_{CA}| \tag{11}$$

Since $\cos \pi/6$ is $\sqrt{3}/2$, the equation (8), (9), (10), and (11) can be expressed by the following equation of $$|V_{AN}| = |V_{BN}| = |V_{CN}| = |V_{AB}| \times \frac{1}{\sqrt{3}} =$$

$$|V_{BC}| \times \frac{1}{\sqrt{3}} = |V_{CA}| \times \frac{1}{\sqrt{3}}.$$

Vector $V_{AB}$ advances by $\pi/6$ with respect to the vector $V_{AN}$, $5\pi/6$ ($\pi/6 + 4\pi/6$) with respect to vector $V_{BN}$, and $9\pi/6$ ($\pi/6 + 4\pi/6 + 4\pi/6$) with respect to vector $V_{CN}$.

The vector $V_{BC}$ advances by $\pi/6$ with respect to vector $V_{BN}$, $5\pi/6$ ($\pi/6 + 4\pi/6$) with respect to vector $V_{CN}$, and $9\pi/6$ ($\pi/6 + 4\pi/6 + 4\pi/6$) with respect to vector $V_{AN}$.

The vector $V_{CA}$ advances by $\pi/6$ with respect to the vector $V_{CN}$, $5\pi/6$ ($\pi/6 + 4\pi/6$) with respect to vector $V_{AN}$, and $9\pi/6$ ($\pi/6 + 4\pi/6 + 4\pi/6$) with respect to vector $V_{BN}$.

Referring to Table 1, phase angles of line-to-line voltage vectors $V_{AB}$, $V_{BC}$, and $V_{CA}$ advanced against the corresponding ground-to-line voltage vectors $V_{AN}$, $V_{BN}$, and $V_{CN}$, respectively, which are necessary to obtain the shifted line-to-line voltage signal S3 having the phases in alignment with those of the voltage vectors $V_{AN}$, $V_{BN}$, and $V_{CN}$ are shown.

TABLE 1

| Location of voltage sensor 13 | Location of voltage sensor 11 | | |
|---|---|---|---|
| | La ($V_{AO}$) | Lb ($V_{BO}$) | Lc ($V_{CO}$) |
| La-Lb ($V_{AB}$) | $\pi/6$ | $5\pi/6$ | $9\pi/6$ |
| Lb-Lc ($V_{BC}$) | $9\pi/6$ | $\pi/6$ | $5\pi/6$ |
| Lc-La ($V_{CA}$) | $5\pi/6$ | $9\pi/6$ | $\pi/6$ |

One example to calculate the zero phase voltage vector $V_O$ based on table 1 in case that the voltage sensor 11 is set at the power line La and the ground-to-line voltage vector $V_{VO}$, is obtained thereby is explained herebelow.

As understood from Table 1, when the voltage sensors 11 and 13 are set at the power line La and between the power lines La and Lb, respectively, the zero phase voltage vector $V_O$ is expressed by the equation of $$V_O = 3 \times (V_{AO} - V_{AN}).$$

Vector $V_{AN}$ is obtained by lagging vector $V_{AB}$ by an angle $\pi/6$ and multiplying the magnitude of the vector $V_{AB}$ by $1/\sqrt{3}$.

When the voltage sensors 11 and 13 are set at the power line La and between the power lines Lb and Lc, respectively, the zero phase voltage vector $V_O$ is expressed by the equation of $$V_O = 3 \times (V_{AO} - V_{AN}).$$

Vector $V_{AN}$ is obtained by lagging vector $V_{BC}$ by an angle $9\pi/6$ and multiplying the magnitude of the vector $V_{BC}$ by $1/\sqrt{3}$.

When the voltage sensor 11 and 13 are set at the power line La and between the power lines Lc and La, respectively, the zero phase voltage vector $V_O$ is expressed by the equation of.

$$V_O = 3 \times (V_{AO} - V_{AN})$$

Vector $V_{AN}$ is obtained by lagging vector $V_{CA}$ by an angle $5\pi/6$ and multiplying the magnitude of the vector $V_{CA}$ by $1/\sqrt{3}$.

Next, in case that the voltage sensor 11 is set at the power line Lb, the zero phase voltage vector $V_O$ is expressed, according to the location of the line-to-line voltage sensor 13, by the following equation.

$$V_O = 3 \times (V_{BO} - V_{BN})$$

Vector $V_{BN}$ is obtained by lagging vector $V_{AB}$ by an angle $5\pi/6$ and multiplying the magnitude of vector $V_{AB}$ by $1/\sqrt{3}$, by lagging vector $V_{BC}$ by an angle $\pi/6$ and multiplying the magnitude of vector $V_{BC}$ by $1/\sqrt{3}$, and by lagging vector $V_{CA}$ by $9\pi/6$ and multiplying the magnitude of vector $V_{CA}$ by $1/\sqrt{3}$.

Furthermore, in case that the voltage sensor 11 is set at the power line Lc, the zero phase voltage vector $V_O$ is expressed, according to the location of the line-to-line voltage sensor 13, by the following equation.

$$V_O = 3 \times (V_{CO} - V_{CN})$$

Vector $V_{CN}$ is obtained by lagging vector $V_{AB}$ by an angle $9\pi/6$ and multiplying the magnitude of vector $V_{AB}$ by $1/\sqrt{3}$, by lagging vector $V_{BC}$ by an angle $5\pi/6$ and multiplying the magnitude of vector $V_{BC}$ by $1/\sqrt{3}$, and by lagging vector $V_{CA}$ by $\pi/6$ and multiplying the magnitude of vector $V_{CA}$ by $1/\sqrt{3}$. It is needless to say that instead of lagging the vector by angles of $\pi/6$, $5\pi/6$, and $9\pi/6$, advancing the vector by angles of $11\pi/6$, $7\pi/6$, and $3\pi/6$, respectively, results in the same. As is clear from the above, the zero phase voltage measuring device Z can measure the zero phase voltage by setting the line-to-line voltage sensor 13 between any two of the three power lines La, Lb, and Lc and setting the voltage sensor 11 at any one of the three power lines.

Figure 6:
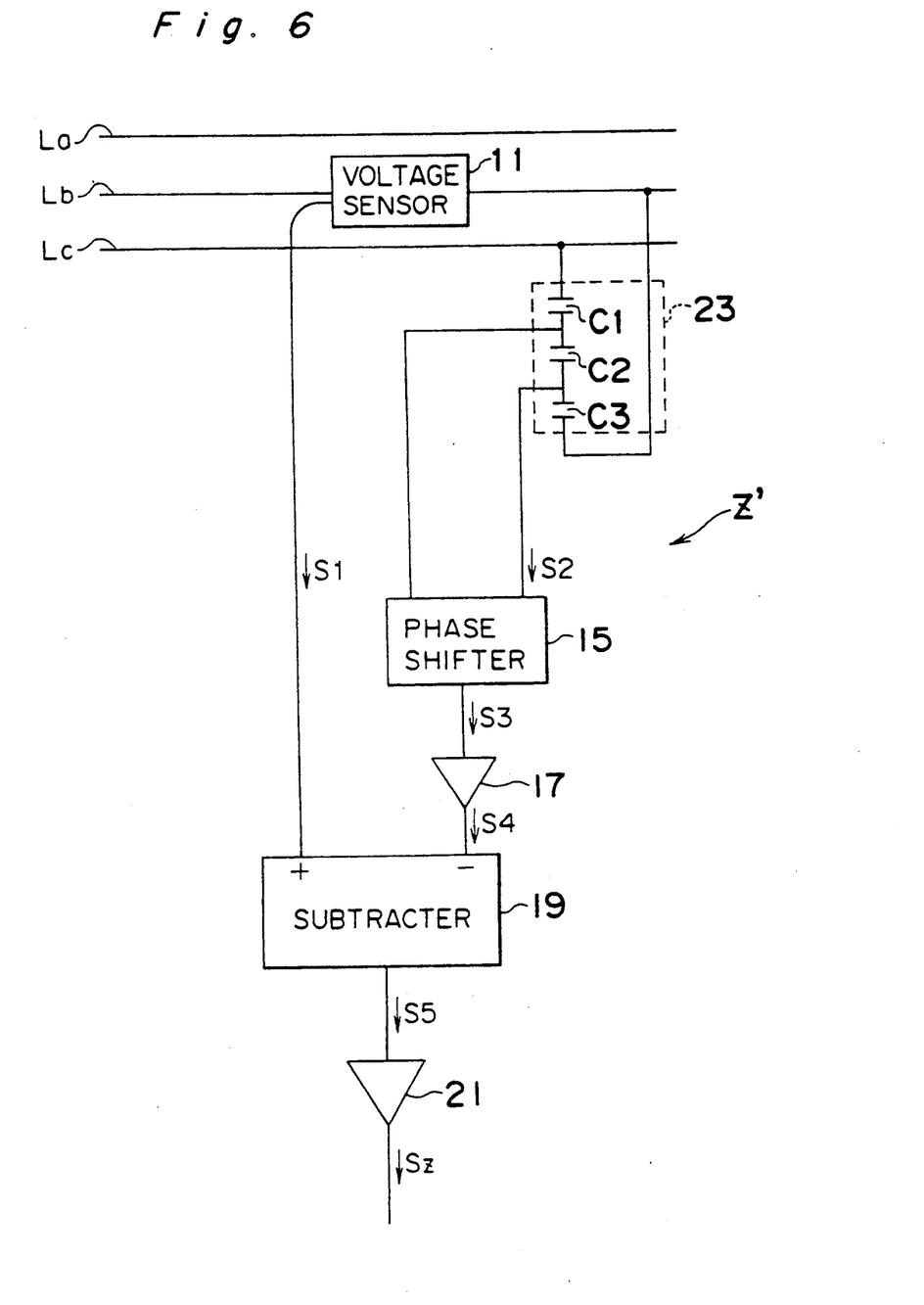
FIG. 6 is a block diagram of an alternation of zero phase voltage measuring device according to the present invention.

Referring to FIG. 6, an alternation of zero phase voltage measuring device Z' according to the above described embodiment is shown. In the zero phase voltage measuring device Z', the line-to-line voltage sensor 13 is replaced with a line-to-line voltage sensor 23 having a first capacitor C1, a second capacitor C2, and a third capacitor C3 which are mutually connected in series. The phase sifter 15 is connected to a line between the first and second capacitors C1 and C2 and a line between the second and third capacitors C2 and C3 and takes the line-to-line voltage signal S2 in proportion to the line-to-line voltage between the power lines Lb and Lc. Since the other construction and the operation thereat are the same as those of the zero phase voltage measuring device Z according to the preferred embodiment described above, the further explanation is omitted for the sake of brevity.

As is clear from the above, the zero phase voltage measuring device Z can measure the zero phase voltage by setting the line-to-line voltage sensor 13 between any two of the three power lines La, Lb, and Lc and setting the voltage sensor 11 at any one of the three power lines. Since the present invention does not need two optical voltage sensors but one only, resulting in cost reduction and the improvement of the preparation of the measurement such as setting the sensors to the power lines and correction of the measuring device.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A zero phase voltage measuring device for measuring the zero phase voltage of a three phase power system having three power lines, said device comprising:
   first voltage detection means for detecting a current ground-to-line voltage presently obtained between the ground and any one of said three power lines;
   second voltage detection means for detecting a current line-to-line voltage representing a presently obtained voltage between any two of said three power lines;
   voltage calculation means for calculating an ideal ground-to-line voltage representing a voltage between the ground and any one of the three power lines when no earth-fault is present, based on said current line-to-line voltage; and
   subtraction means for subtracting said ideal ground-to-line voltage from said current ground-to-line voltage to produce a zero phase voltage signal.

2. A zero phase voltage measuring device as claimed in claim 1, further comprising first multiplier means for multiplying said zero phase voltage signal by three.

3. A zero phase voltage measuring device as claimed in claim 1, wherein said voltage calculation means comprises:
   phase shift means for shifting the phase of said current line-to-line voltage by a predetermined angle to produce a phase adjusted voltage having a phase in alignment with the phase of said ideal ground-to-line voltage; and
   second multiplier means for multiplying said phase adjusted voltage signal by $1/\sqrt{3}$ to produce said ideal ground-to-line voltage.

4. A zero phase voltage measuring device as claimed in claim 3, wherein said predetermined angle is selected from any one of $\pi/6$, $5\pi/6$, and $9\pi/6$.

5. A zero phase voltage measuring device as claimed in claim 1, wherein said second voltage detection means comprises a transformer having a primary coil connected to said any two of three power lines and a secondary coil connected to said voltage calculation means.

6. A zero phase voltage measuring device as claimed in claim 1, wherein said second voltage detection means comprises a first capacitor, a second capacitor, and a third capacitor, said first, second, and third capacitors being connected in series, said series connection being connected between any two of the three power lines.

* * * * *

UNITED STATES PATENT AND TRADEMARK OFFICE
CERTIFICATE OF CORRECTION

PATENT NO. : 5,214,373
DATED : May 25, 1993
INVENTOR(S) : Nara et al.

It is certified that error appears in the above—identified patent and that said Letters Patent is hereby corrected as shown below:

Column 3, line 65, delete "$V_0 = V_{A0} + V_{B0} V_{C0}$," and insert -- $V_0 = V_{A0} + V_{B0} + V_{C0}$ --.

Column 5, line 52, delete $V_{V0}$, and insert -- $V_{A0}$ --.

Signed and Sealed this

Fifth Day of April, 1994

Attest:

BRUCE LEHMAN

Attesting Officer  Commissioner of Patents and Trademarks